(12) United States Patent
Zhou

(10) Patent No.: US 12,052,028 B2
(45) Date of Patent: Jul. 30, 2024

(54) SAR ADC AND ELECTRONIC DEVICE

(71) Applicant: SILEAD Inc., Shanghai (CN)

(72) Inventor: Jinling Zhou, Shanghai (CN)

(73) Assignee: SILEAD Inc., Shanghai (CN)

( * ) Notice: Subject to any disclaimer, the term of this patent is extended or adjusted under 35 U.S.C. 154(b) by 150 days.

(21) Appl. No.: 17/844,413

(22) Filed: Jun. 20, 2022

(65) Prior Publication Data

US 2023/0208431 A1    Jun. 29, 2023

(30) Foreign Application Priority Data

Dec. 23, 2021   (CN) .......................... 202111593130.7

(51) Int. Cl.
| | |
|---|---|
| *H03M 1/12* | (2006.01) |
| *H03K 19/17736* | (2020.01) |
| *H03K 19/20* | (2006.01) |
| *H03M 1/20* | (2006.01) |
| *H03M 1/36* | (2006.01) |
| *H03M 1/46* | (2006.01) |

(52) U.S. Cl.
CPC ........ *H03M 1/462* (2013.01); *H03K 19/1774* (2013.01); *H03K 19/20* (2013.01); *H03M 1/206* (2013.01); *H03M 1/361* (2013.01)

(58) Field of Classification Search
CPC ...... H03M 1/462; H03M 1/206; H03M 1/361; H03K 19/20; H03K 19/1774

USPC ................................. 341/155, 144, 118, 120
See application file for complete search history.

(56) References Cited

U.S. PATENT DOCUMENTS

| | | | | |
|---|---|---|---|---|
| 8,957,802 | B1* | 2/2015 | Evans ................. | H03M 1/0863 |
| | | | | 341/161 |
| 2013/0009796 | A1* | 1/2013 | Sakiyama ........... | H03M 1/0624 |
| | | | | 341/110 |
| 2016/0126962 | A1* | 5/2016 | Masuko ................ | H03L 7/0818 |
| | | | | 341/118 |

* cited by examiner

*Primary Examiner* — Peguy Jean Pierre
(74) *Attorney, Agent, or Firm* — IPro, PLLC

(57) ABSTRACT

A SAR ADC and an electronic device are disclosed. The SAR ADC includes a read clock generation circuit, configured to connect to a first output terminal and a second output terminal of a dynamic comparator, and generate a read clock signal for reading a first or a second comparison result based on the first and the second comparison result received from the dynamic comparator. The invention reads the comparison result using the read clock signal generated by grabbing the output of the comparator, and can improve the overall analog-to-digital conversion speed of the SAR ADC. Further, the present invention can detect the occurrence of metastable state of the comparator by judging that the output of the comparator has no pulse, and read the comparison result based on the backup clock generated by the operating clock of the comparator.

19 Claims, 7 Drawing Sheets

SAR ADC AND ELECTRONIC DEVICE

CROSS-REFERENCE TO RELATED APPLICATION

This application claims the priority of Chinese patent application number 202111593130.7, filed on Dec. 23, 2021, the entire contents of which are incorporated herein by reference.

TECHNICAL FIELD

The disclosure herein relates to the field of circuits, and in particular, to a SAR ADC and an electronic device.

BACKGROUND

The successive approximation analog-to-digital converter (i.e., SAR ADC) is a common analog-to-digital conversion component, typically used at moderate to high-resolution sampling rates, and is widely used due to its low power consumption and small size.

In existing SAR ADCs, a separate read clock is used to read the output of the comparator. FIG. 1 shows a timing diagram of reading a comparison result of a comparator in the prior art. As shown in the figure, clkc is the operating clock of the comparator, Q is the comparison result, and clk is the clock for reading Q. In the prior art, clk is a reading clock independent of clkc. Assuming that the comparator starts to operate when clkc goes high, and after time d1, the comparator generates a comparison result Q. In order to prevent metastability when clk grabs Q, there must be a delay d2 between Q and clk, so the delay d3 between clkc and clk must be designed to be no less than d1+d2 to ensure that Q can be correctly grabbed by clk. Since d1 is a value related to the input and PVT (process, voltage, temperature), in order to ensure that clk can read Q in any case, d3 must be designed to cover the sum of d2 and the largest d1, but this will slow down the conversion speed of the SAR ADC.

Therefore, an improved SAR ADC is required.

SUMMARY

One technical problem to be solved by the present disclosure is to provide an improved SAR ADC. By using the output of the comparator as a clock to read the comparison result of the comparator, the invention can read the result immediately after the comparison result is generated, and avoid reading after the maximum generation time of the comparison result in the prior art, thereby improving the analog-digital conversion speed.

According to a first aspect of the present disclosure, there is provided a SAR ADC, including: a dynamic comparator, comprising a first output terminal and a second output terminal, the dynamic comparator generates a first comparison result and a second comparison result at the first output terminal and the second output terminal respectively based on the comparator operating clock; and a read clock generation circuit, connecting to the first output terminal and the second output terminal, and configured to generate a read clock signal for reading the first or second comparison result based on the first comparison result and the second comparison result received from the dynamic comparator.

Optionally, the read clock generation circuit comprises: a first logic gate circuit, configured to generate a read pulse signal when the first comparison result and the second comparison result correspond to different levels, and the read pulse signal is delayed to obtain the read clock signal.

Optionally, the first logic gate circuit comprises: a metastable signal extraction logic gate connected to the first output terminal and the second output terminal and capable of extracting signals of an identical level when a metastable state occurs, and the metastable signal extraction logic gate is set to extract the signals of the identical level when the levels of the first and the second comparison results are both above an inversion threshold.

Optionally, the metastable signal extraction logic gate comprises: a first NOT gate connected to the first output terminal, and a second NOT gate connected to the second output terminal, wherein: when the reset level of the dynamic comparator is a high level, the inversion threshold of the first NOT gate and the second NOT gate is set to be between a low level and a metastable level; when the reset level of the dynamic comparator is a low level, the inversion threshold of the first NOT gate and the second NOT gate is set to be between the high level and the metastable level.

Optionally, the signals of the identical level extracted by the metastable signal extraction logic gates when a metastable state occurs causes the read clock generation circuit to generate the read clock signal based on the operating clock of the dynamic comparator.

Optionally, the read clock generation circuit further comprises: a signal selection circuit, configured to select a read pulse signal generated based on the first comparison result and the second comparison result to generate the read clock signal when the first comparison result and the second comparison result correspond to different levels, and select the clock pulse signal generated based on the dynamic comparator operating clock to generate the read clock signal when the first comparison result and the second comparison result correspond to an identical level.

Optionally, the SAR ADC of claim 6 further comprises: a data register that reads the first comparison result using the read clock signal generated by the signal selection circuit.

Optionally, the read clock generation circuit further comprising: a first logic gate circuit, configured to generate the read pulse signal based on the first comparison result and the second comparison result when the first comparison result and the second comparison result correspond to different levels; and a clock pulse generating circuit, configured to generate the clock pulse signal based on the comparator operating clock, wherein, the read pulse signal is generated before the clock pulse signal.

Optionally, the signal selection circuit comprises: a first transmission gate, the two control terminals of which are respectively coupled to the read pulse signal and the inverted signal of the read pulse signal, and the input terminal of which is coupled to the read pulse signal, when the read pulse signal goes high, the first transmission gate is turned on to output the read pulse signal; and a second transmission gate, the two control terminals of which are respectively coupled to the inverted signal of the read pulse signal and the read pulse signal, and the input terminal of which is coupled to the clock pulse signal, when the read pulse signal goes low, the second transmission gate is turned on to output the clock pulse signal; and a delay circuit, generating the read clock signal after delaying the outputs of the first transmission gate and the second transmission gate.

Optionally, the signal selection circuit comprises: a logic circuit, generating a selection pulse signal based on the read pulse signal and the clock pulse signal, and the selection pulse varies according to the clock pulse signal when the read pulse signal has a level indicating that the first comparison result and the second comparison result correspond to the identical level; a transmission gate, the two control terminals of which are respectively coupled to the selection pulse signal and the inversed signal of the selection pulse signal, and the input terminal of which is coupled to the read pulse signal, when the read pulse signal has a has a level indicating that the first comparison result and the second comparison result correspond to different levels, the transmission gate is turned on to output the read pulse signal; and a switch transistor, the control terminal of which is coupled to the selection pulse signal, and the output terminal of which is coupled to the output terminal of the transmission gate, when the selection pulse signal does not vary according to the clock pulse signal, the switch transistor is turned off, and when the selection pulse signal varies according to the clock pulse signal, the switch transistor output the clock pulse signal together with the transmission gate; and a delay circuit, coupled to the output of the transmission gate and the switch transistor, delays the output to generate the read clock signal.

According to a second aspect of the present disclosure, there is provided a synchronous ADC, including: a first read clock generation circuit, connected to a first output terminal and a second output terminal of a dynamic comparator, generating a first signal based on receiving a first comparison result from the first output terminal and a second comparison result from the second output terminal; a clock pulse generating circuit, connected to the comparator operating clock of the dynamic comparator, generating a second signal based on the operating clock; and a metastable detection circuit, configured to select the first signal to generate a read clock signal to read the first comparison result of the dynamic comparator when it is detected that the first signal includes a read pulse signal, and select the second signal to generate the read clock signal to read the first comparison of the dynamic comparator when the read pulse signal is not detected in the first signal.

According to a third aspect of the present disclosure, there is provided an electronic device comprising the SAR ADC of the first aspect of the present disclosure.

Therefore, the present invention reads the comparison result using the read clock signal generated by grabbing the output of the comparator, and can improve the overall analog-to-digital conversion speed of the SAR ADC. Further, the present invention can detect the occurrence of metastable state of the comparator by judging that the output of the comparator has no pulse, and read the comparison result based on the backup clock generated by the operating clock of the comparator. Thus, there is no need to reset the comparator even when metastability occurs, ensuring efficient operation of the SAR ADC.

BRIEF DESCRIPTION OF FIGURES

The above and other objects, features and advantages of the present disclosure will become more apparent from the more detailed description of the exemplary embodiments of the present disclosure taken in conjunction with the accompanying drawings, wherein the same reference numerals generally refer to the same parts in the exemplary embodiments of the present disclosure.

DETAILED DESCRIPTION

Preferred embodiments of the present disclosure will be described in more detail below with reference to the accompanying drawings. While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

It should be understood that the "first" and "second" mentioned in the present disclosure are only used to distinguish different objects of the same kind, and do not imply the order, importance, etc. of these objects.

Figure 2:
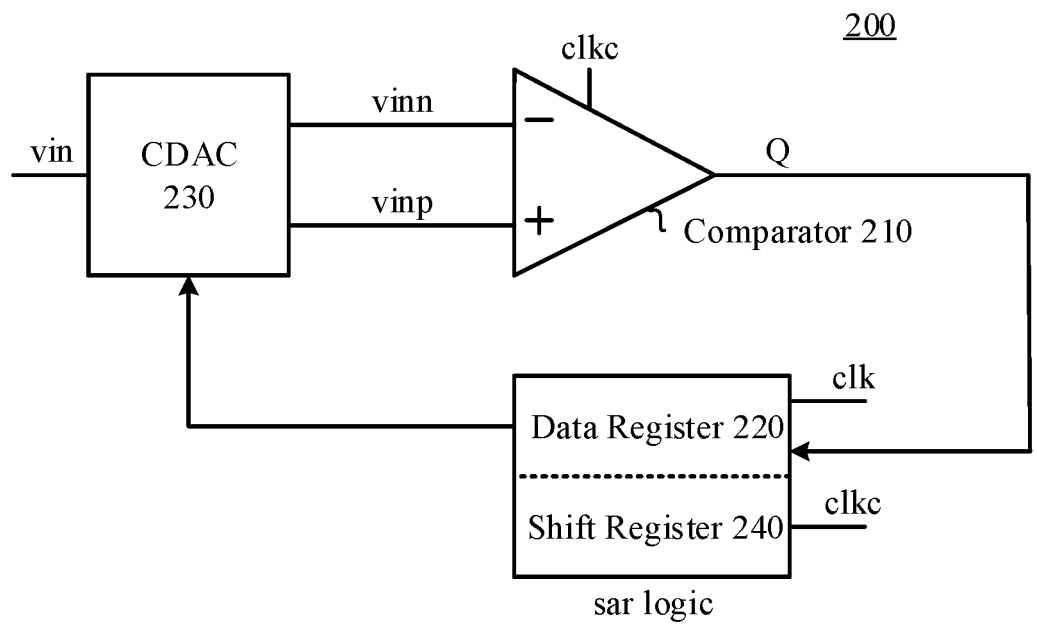
FIG. 2 shows an example of the composition of the SAR ADC.

The successive approximation analog-to-digital converter (i.e., SAR ADC) is a common analog-to-digital conversion element. As the name suggests, a SAR ADC essentially implements a binary search algorithm. Although there are many ways to implement a SAR ADC, its basic structure is very simple. FIG. 2 shows an example of the composition of the SAR ADC. As shown, SAR ADC 200 may include a dynamic comparator 210, a data register 220, a digital-to-analog converter (DAC) 230 and a shift register 240.

To implement the binary search algorithm, the N-bit data register 220 is first set at midscale (i.e.: 100 . . . 00, MSB set to 1). Thus, initially, the $V_{DAC}$ output by the digital-to-analog converter 230 is set to $V_{REF}/2$, where $V_{REF}$ is the reference voltage provided to the SAR ADC 200. In the example of FIG. 2, the digital-to-analog converter 230 is implemented as a capacitive digital-to-analog converter (CDAC), and the input $V_{IN}$ to be analog-to-digital converted by the SAR ADC 200 and the output $V_{DAC}$ of the digital-to-analog converter 230 are denoted as vinn and vinp. Then, the comparator 210 determines whether the input voltage $V_{IN}$ is smaller or larger than $V_{DAC}$. If $V_{IN}$ is greater than $V_{DAC}$, the comparison result Q output by the comparator 210 is a logic high level or 1 (of course, it may also be a low level or 0 based on different logic implementations), and the MSB of the N-bit data register 220 is kept as 1. On the contrary, if $V_{IN}$ is less than $V_{DAC}$, the comparison result Q output by the comparator 210 is a logic low level, and the MSB of the N-bit data register 220 is cleared to 0. Here, the data register 220 uses clk as the clock to read the comparison result Q as the input, The output of the data register 220 determines the connection method of the capacitors in the digital-to-analog converter 230, and the digital-to-analog converter 230 outputs the analog voltages vinn and vinp according to the adjusted capacitors for the comparator 210 to compare. Shift register 240 (shift register 240 and data register 220 together can also be seen as SAR control logic, ie, SAR logic) moves to the next bit and sets that bit high for the next comparison. This process continues until the LSB. After the above operations are completed, the analog-to-digital conversion is completed, and the N-bit conversion result is stored in the data register 220.

Figure 1:
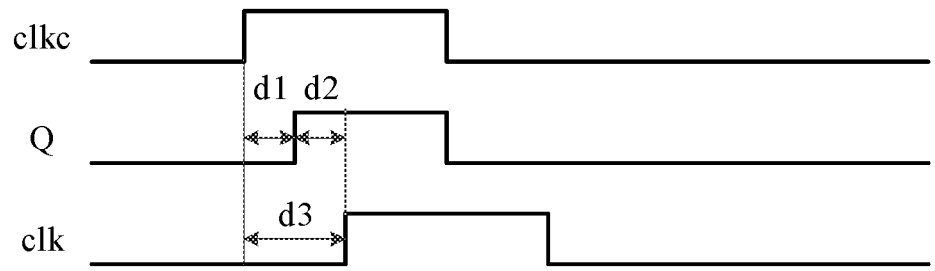
FIG. 1 shows a timing diagram of reading a comparison result of a comparator in the prior art.

In the existing SAR ADC, the data register 220 uses a read clock clk to read the output of the comparator 210, as shown in FIG. 1, the clock clk can be regarded as the clock obtained by the comparator operating clock clkc after a fixed large delay. In other words, the data register 220 uses a 0-independent clock clk to read the logic low or logic high output of the comparator 210. Although the delay d2 can be relatively fixed, since the delay d1 will vary due to changes in the operating environment and input, the delay d3 of clk compared to clkc needs to satisfy the sum of d1 with the largest value and d2 (that is, $d3=d1_{max}+d2$), to ensure that Q is correctly read into the data register 220. The fixed delay d3 described above reduces the read speed, thereby reducing the overall efficiency of the SAR ADC.

To this end, the present invention proposes an improved SAR ADC. By using the output of the dynamic comparator as the clock to read the comparison result of the dynamic comparator, the present invention can read the result immediately after the comparison result is generated, avoiding the need for the clock in the prior art to meet the maximum comparison result generation time for reading. This improves the analog-to-digital conversion speed.

Figure 3:
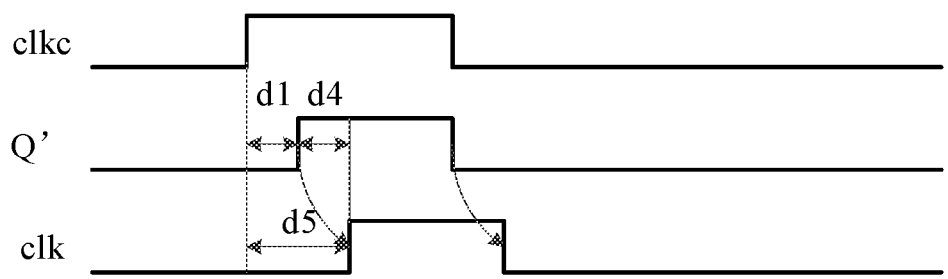
FIG. 3 shows a timing diagram for reading a comparison result of a comparator according to one embodiment of the present invention.

FIG. 3 shows a timing diagram for reading the comparison result of the dynamic comparator according to one embodiment of the present invention. As shown in the figure, clkc is the operating clock of the dynamic comparator (hereinafter referred to as "comparator operating clock"), and Q' is the comparison result (as will be described in detail below, the comparison result here is one of the comparison results on the two output terminals), clk is a read clock (hereinafter referred to as "read clock signal") generated based on the comparison result Q'. Assuming that the dynamic comparator starts to operate when clkc goes high, and after time d1, the dynamic comparator generates a comparison result Q'. d4 is a fixed delay after the comparison result Q' is generated. In other words, the delay of clk relative to clkc is no longer a fixed value at this time, but a value that changes dynamically with the change of d1, even if the value of d4 is the same as that of d2, because $d5=d1_{now}+d4$, so the time delay d5 of clk relative to clkc in the present invention is smaller than d3 in the prior art, so the read speed of the SAR ADC can be improved.

In addition, in a preferred embodiment, the present invention also includes corresponding mechanisms to deal with metastability. Specifically, for the comparator 210, if a metastable state occurs and the two input voltages vinp and vinn of the comparator have not been separated when the input voltage is sampled (that is, vinp and vinn are very close, so that vinp-vinn is approximately equal to 0), then it will take a long time for the comparator 210 to achieve the output logic reaching the standard level, that is to say, the time that the circuit is in the intermediate state becomes longer, which makes the circuit "react" slow, and the operating time left for the dynamic comparator is limited. A dynamic comparator cannot compare a definite result (high or low) in this limited time, that is "a metastable state".

Figure 4:
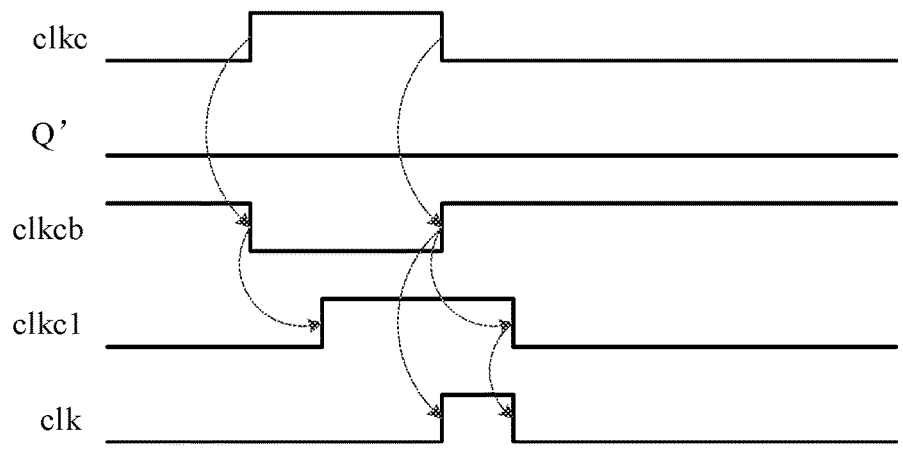
FIG. 4 shows a timing diagram for reading a comparison result of a comparator according to one embodiment of the present invention.

FIG. 4 shows a timing diagram for reading the comparison result of the comparator according to one embodiment of the present invention. The difference from FIG. 3 is that the comparison result Q' actually has no signal at this time due to the metastable state of the comparator 210. At this time, since the read clock clk cannot be obtained through the comparison result Q' of the comparator 210, when the metastable state occurs, the read clock clk is obtained by performing corresponding processing on the comparator operating clock clkc in the present disclosure. In the example of FIG. 4, the read clock clk is obtained by performing an AND operation with the inverted signal clkcb of the comparator operating clock clkc and the delay signal clkc1 of the comparator operating clock clkc. However, it should be understood that other operations may also be used to obtain the read clock clk based on the comparator operating clock clkc, for example, only a sufficient delay is performed on clkc.

In order to realize the dynamic generation of the read clock clk based on the comparison result Q' shown in FIG. 3, the SAR ADC of the present invention needs an additional read clock generation circuit. In a preferred embodiment, in order to be able to read the comparison result Q' even when a metastable state occurs and thus avoid the reset of the comparator, the read clock generation circuit of the present invention can also generate a read clock signal clk based on the comparator operating clock clkc. The read clock generation circuit also includes a signal selection circuit: when a metastable state does not occur, the read clock signal clk generated based on the comparison result Q' is selected; when a metastable state occurs, the read clock signal clk generated by the operating clock clkc of the comparator is selected. Therefore, FIG. 5 shows a schematic diagram of the composition of a SAR ADC according to an embodiment of the present invention.

Figure 5:
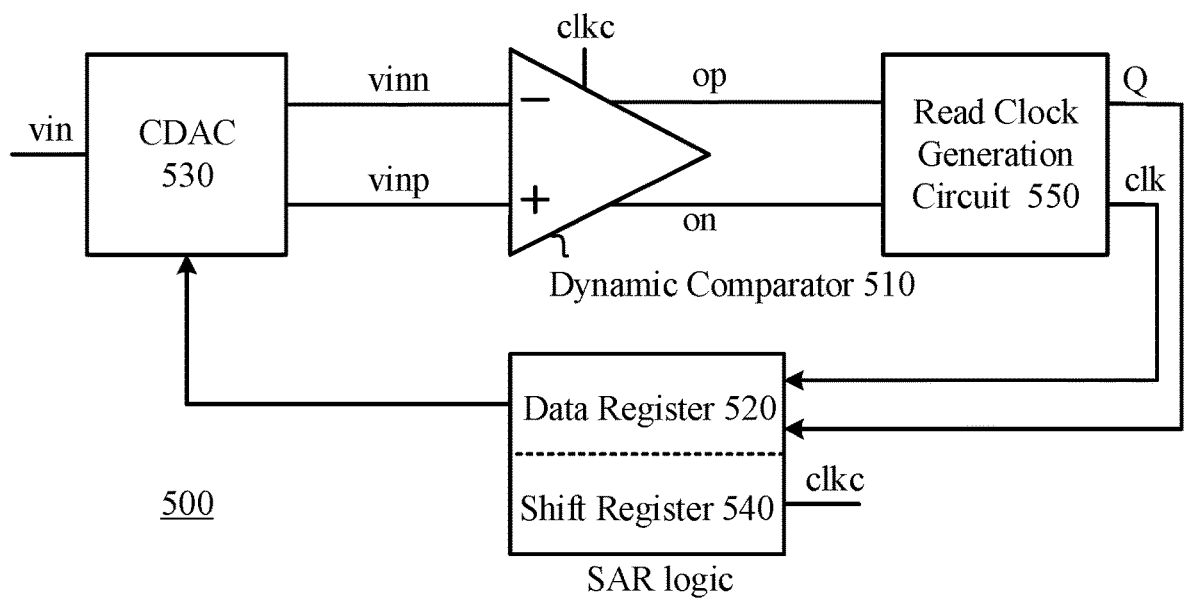
FIG. 5 shows a schematic diagram of the composition of a SAR ADC according to an embodiment of the present invention.

As shown in FIG. 5, compared with FIG. 2, the comparator used in the SAR ADC of the present invention is compared when the comparator operating clock (clkc shown in the figure) is valid, and is reset when the comparator operating clock is invalid. The comparator shown is namely a dynamic comparator 510. It should be understood that the SAR ADC applicable to the present invention may also have other connection relationships of data registers, DACs and comparators other than those shown in the figure, as long as successive approximation comparison can be implemented.

Further, the SAR ADC 500 shown in FIG. 5 also includes a read clock generation circuit 550. Two input terminals of the circuit 550 are connected to the two output terminals of the dynamic comparator 510, and the circuit 550 have two output terminals, which output the comparison result Q of the dynamic comparator 510 and the read clock signal clk for reading the comparison result Q to the data register 520, respectively.

Thus, in one embodiment, the read clock generation circuit 550 connects the first output terminal and the second output terminal of the dynamic comparator 510, and based on the first comparison result received from the first output terminal (e.g., op) and the second comparison result (e.g., on) from the second output terminal to generate a read clock signal clk for reading the first comparison result (e.g., op) generated by the dynamic comparator 510.

It should be understood that, since the dynamic comparator 510 in the SAR ADC is used to compare the input voltage vinn with the digital-to-analog conversion voltage vinp output by the data register 520 and output by the CDAC 530, under normal comparison conditions, in the two outputs op and on of the dynamic comparator 510, one must output a high level and the other output a low level. For example, when using the output of op or von as the comparison signal Q, op or von will output a high level when vinn>vinp, and output a low level when vinn<vinp.

In other words, in the connection shown in FIG. 2, the level value Q read by the data register 220 is sometimes high and sometimes low due to the magnitude relationship between vinn and vinp. Q shown in FIG. 1 is an example of reading when the output level value of the comparator 210 is a high value, and it should be understood that when the Q value is a low value, the Q value can be read by clk at the time d5 after the rising edge of clkc.

In FIG. 5 showing an embodiment of the present invention, the level value Q read by the data register 520 is sometimes high and sometimes low due to the magnitude relationship between vinn and vinp. But the difference is that the circuit 550 for generating the read clock signal clk needs to acquire the signals of the two outputs of the dynamic comparator 510 at the same time, and thereby generate the read clock for reading the output on one output terminal. That is, in FIGS. 3 and 4, Q' may refer to the signals op and on from the two output terminals of the dynamic comparator 510. Since when the dynamic comparator 510 is normally compared in one operating cycle, one of the two outputs op and on must be high and the other is low, so the read clock generating circuit 550 of the present invention can extract a pulse from op and on, use it as the comparator output Q' to generate the read clock signal clk shown in FIG. 3, or use the backup clock generated by the comparator operating clock clkc as the clock to read the Q value when the no-change pulse Q' is detected as shown in FIG. 4.

Specifically, the read clock generation circuit 550 of the present invention may include a first logic gate circuit for generating a read pulse signal when the first comparison result and the second comparison result correspond to different levels (e.g., Q' in FIG. 3). The read pulse signal can be delayed and thereby the read clock signal can be derived.

Figure 6:
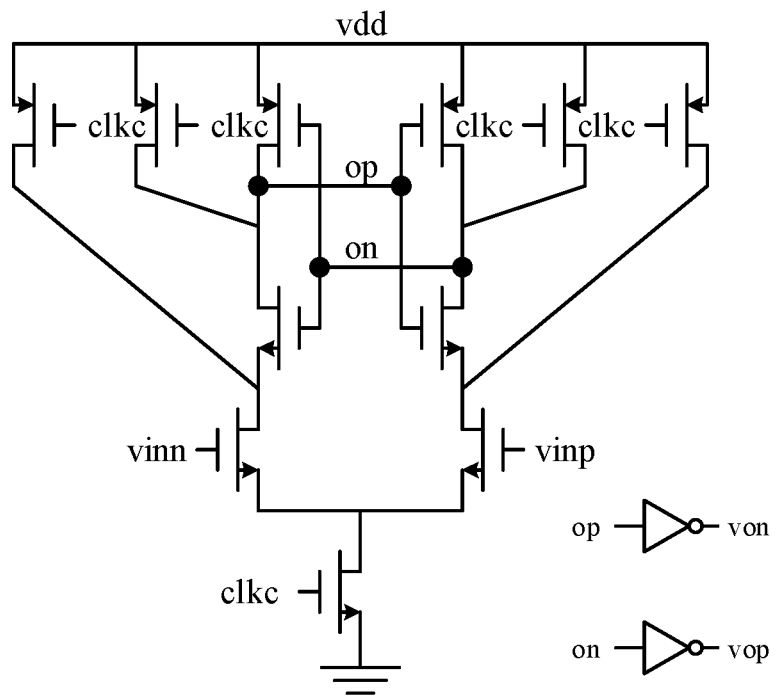
FIG. 6 shows a schematic diagram of the composition of a dynamic comparator used in an embodiment of the present invention.
Figure 7:
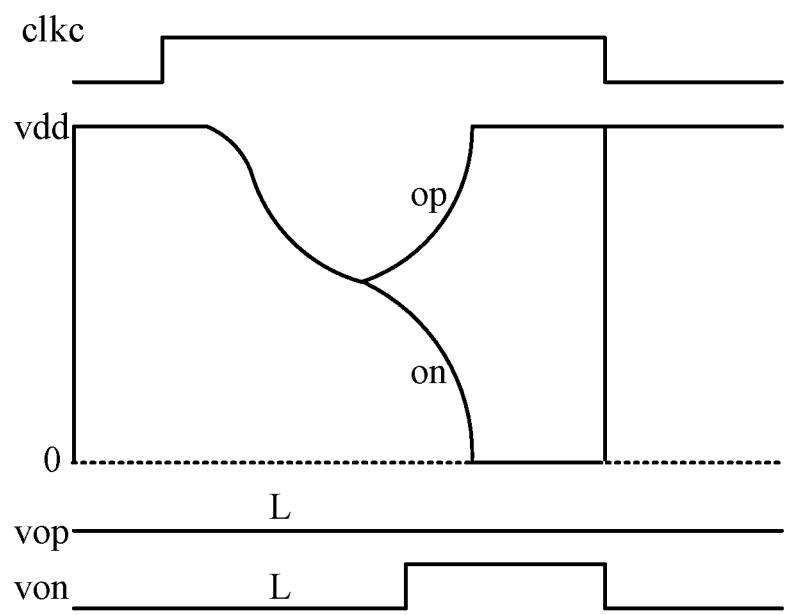
FIG. 7 shows a schematic diagram of the level change of the two output terminals after the dynamic comparator starts to operate.

FIG. 6 shows a schematic diagram of the composition of a dynamic comparator used in an embodiment of the present invention. FIG. 7 shows a schematic diagram of the level change of the two output terminals after the dynamic comparator starts to operate. The dynamic comparator shown in the figure outputs a reset level of a high level (for example, Vdd in the figure) when the operating clock clkc is at a low level, and starts the comparison when the rising edge of clkc arrives, and based on the relative levels of vinn and vinp, one of the two outputs must be pulled low (shown as on) and forced high after the falling edge of clkc arrives. In a preferred embodiment, an inverter can be connected after each output op and on. By setting the inversion threshold of the inverters reasonably, it is possible to ensure that for an output which is not pulled down to 0 (shown as op), its inverted output vop is always output low (L), while for an output which is pulled low before the arrival of the falling edge of clkc (shown as on), its inverted output von outputs a high pulse.

Although the figure shows a dynamic comparator whose reset level is high and compares after the operating clock clkc jumps high, those skilled in the art should understand that a dynamic comparator with a low reset level or a dynamic comparator that compares after the operating clock clkc jumps low can also be used. But no matter what kind of comparator is used, when the dynamic comparator is comparing normally, its two outputs (whether on and op) must have different levels. Thus, the read clock generation circuit 550 of the present invention may include a first logic gate circuit for generating (extracting) a read pulse signal when the first comparison result 'op' and the second comparison result 'on' correspond to different levels. And the read pulse signal can be delayed and used to obtain the read clock signal clk for reading the comparison result Q. In the examples of FIG. 6 and FIG. 7, the first logic gate circuit can be an OR gate and two NOT gates, and the two NOT gates invert the first and second comparison results op and on to generate vop and von, and then pass the OR gate. Thus, a read pulse can be extracted from the OR operation of von and vop when the dynamic comparator 510 is comparing normally. In the embodiment in which the reset level of the dynamic comparator is low, when a metastable state occurs, and the first comparison result 'op' and second comparison result 'on' are both low levels, the first logic gate circuit can be implemented by only one OR gate, which extracts a read pulse from the OR operation of 'on' and 'op' when the dynamic comparator 510 is normally compared (one of 'on' and 'op' is high and the other is low). In other examples, the first logic gate can also be a NOR gate (if the subsequent circuit requires a low-level pulse); in the case that von and vop are high-level when reset, the first logic gate can also be an AND gate (if the subsequent circuit needs a low pulse), or a NAND gate (if the subsequent circuit needs a high pulse). In other words, the present invention does not limit the specific implementation of the first logic gate, as long as it can extract a read pulse that can be used to generate clk from the two output terminals of the dynamic comparator.

Further, in order to cope with the "metastable state" that may occur during the comparison of the dynamic comparator as described above, the circuit 550 added to the SAR ADC by the present invention may further include additional circuits.

Figure 8:
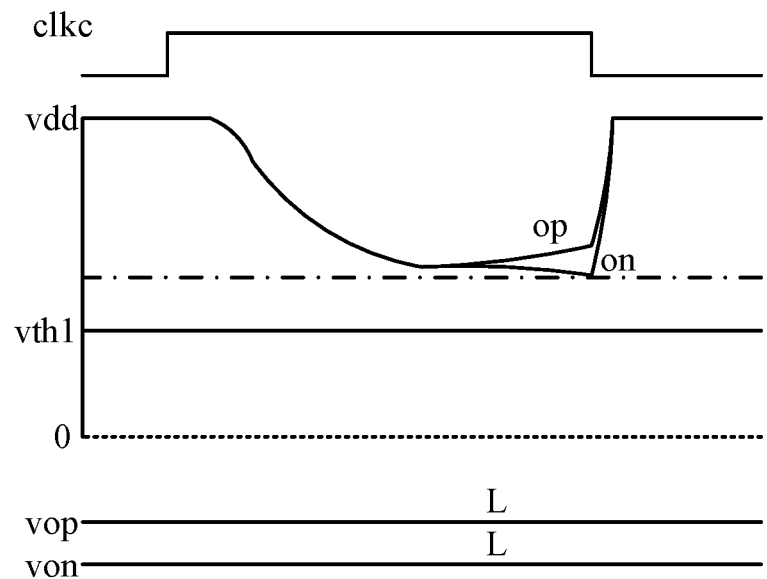
FIG. 8 shows a schematic diagram of the level change of the two output terminals of the dynamic comparator when metastable state occurs.

First, the occurrence and detection of the metastable state will be described in conjunction with the output state of the dynamic comparator when the metastable state occurs. FIG. 8 shows a schematic diagram of the level change of the two output terminals of the dynamic comparator when a metastable state occurs. Compared to the case in FIG. 7 where one of the two inputs is pulled low smoothly (i.e., a metastable state does not occur) within the high pulse width of clkc, FIG. 8 shows that there is no comparison result within the level pulse width of clkc, that is, a metastable state occurs. As shown in FIG. 8, the two outputs 'op' and 'on' of the dynamic comparator cannot be completely separated within the high level pulse width of clkc, and neither of the two outputs is pulled to ground, and they are pulled down together and pulled up again when the falling edge of clkc arrives.

Thus, it is necessary to detect the above metastable state in the dynamic comparator. In the example of FIG. 8, the inverters respectively connected after 'on' and 'op' as described above can play the role of a metastable signal extractor. Specifically, the inversion threshold $V_{th1}$ of the two inverters can be set relatively low, for example, it is lower than a metastable level to which it will be pulled down when a metastable state occurs (as shown by the dotted line in the figure), so that it is guaranteed that von and vop are always low when a metastable state occurs. Therefore, for the dynamic comparator 510, since the inverters with lower inversion thresholds $V_{th1}$ are connected to the output 'op' and 'on', respectively, when a metastable state does not occur, one of von and von must generate a high-level pulse. While when a metastable state occurs, both von and von remain low. Therefore, by detecting this high-level pulse (i.e., the read pulse signal), it can be determined whether a metastable state occurs in the comparator. In addition to the use of two inverters, each connected to the first and second outputs of the dynamic comparator, as metastable signal extraction logic gates, other forms of logic gates can also be used, as long as these logic gates extract the signal output by the first and the second output terminal as input, and its logic operation and determination level is between the inverse level of the reset level (0V in this example) and the metastable level.

Thus, the circuit 550 of FIG. 5 may also include a signal selection circuit, which can determine that the dynamic comparator 510 is non-metastable when the first comparison result 'op' and the second comparison result 'on' correspond to different levels, and thus choose to generate the read clock signal clk based on the read pulse signal generated by the first and second comparison result; and can determine that the dynamic comparator 510 is metastable when the first comparison result 'op' and the second comparison result 'on' correspond to an identical level, and thus choose to generate the read clock signal clk based on the clock pulse signal generated by the operation clock clkc of the dynamic comparator. For example, when Q' is always low in FIG. 4, the clk generated by clkcb and clkc1 is selected to read the comparison result Q. The signal selection circuit can also be considered as a metastable state detection circuit because it can select other clocks when a metastable state occurs.

Further, the circuit 550 may include a clock pulse generation circuit for generating the aforementioned clock pulse signal based on the comparator operating clock clkc, and the following embodiments will describe in detail that the clock pulse signal is delayed when selected by the signal selection circuit and used to generate the read clock signal clk. For example, when generating the clock shown in FIG. 4, the clock pulse generating circuit may include an inversion path for obtaining the inverted clock clkcb of the operating clock clkc; a delay path for obtaining the delay clock clkc1 of clkc; and an AND gate, used to obtain the clk shown in FIG. 4. In other embodiments, clkc may also be directly delayed for a sufficient period to obtain clk. The present invention does not limit the way the clock pulse signal is generated based on the operating clock.

Thus, when receiving the read pulse signal (e.g., Q' in FIG. 3), the signal selection circuit can use the read pulse signal to generate the read clock signal clk for the data register 520 to read the first comparison result generated by the dynamic comparator 510 (i.e., the Q sent to the data register 520 in FIG. 5); when the read pulse signal is not received (e.g., Q' in FIG. 4), the signal selection circuit can be turned to use the clock pulse signal to generate the read clock signal clk for the data register 520 to read the first comparison result generated by the dynamic comparator 510 (i.e., the Q sent to the data register 520 in FIG. 5). For this reason, if there is a read pulse signal being generated (Q' as shown in FIG. 3), the read pulse signal arrives before the clock pulse signal. If there is no read pulse signal being generated (Q' as shown in FIG. 4), the signal selection circuit then uses the clock pulse signal to generate the read clock signal.

Thus, in one embodiment, a clock pulse signal (e.g., p1 in FIG. 10) may be generated based on each valid pulse of the operating clock, eg, clkc in a high level. Whether the clock pulse signal is used to generate the read clock of the comparison result depends on whether a read pulse signal is generated. If there is a read pulse signal (e.g., vo in FIG. 10) being generated, the signal selection circuit directly uses the read pulse signal to generate the read clock signal clk, and if there is no read pulse signal being generated, the signal selection circuit uses the clock pulse signal to generate the read clock signal clk.

Figure 9:
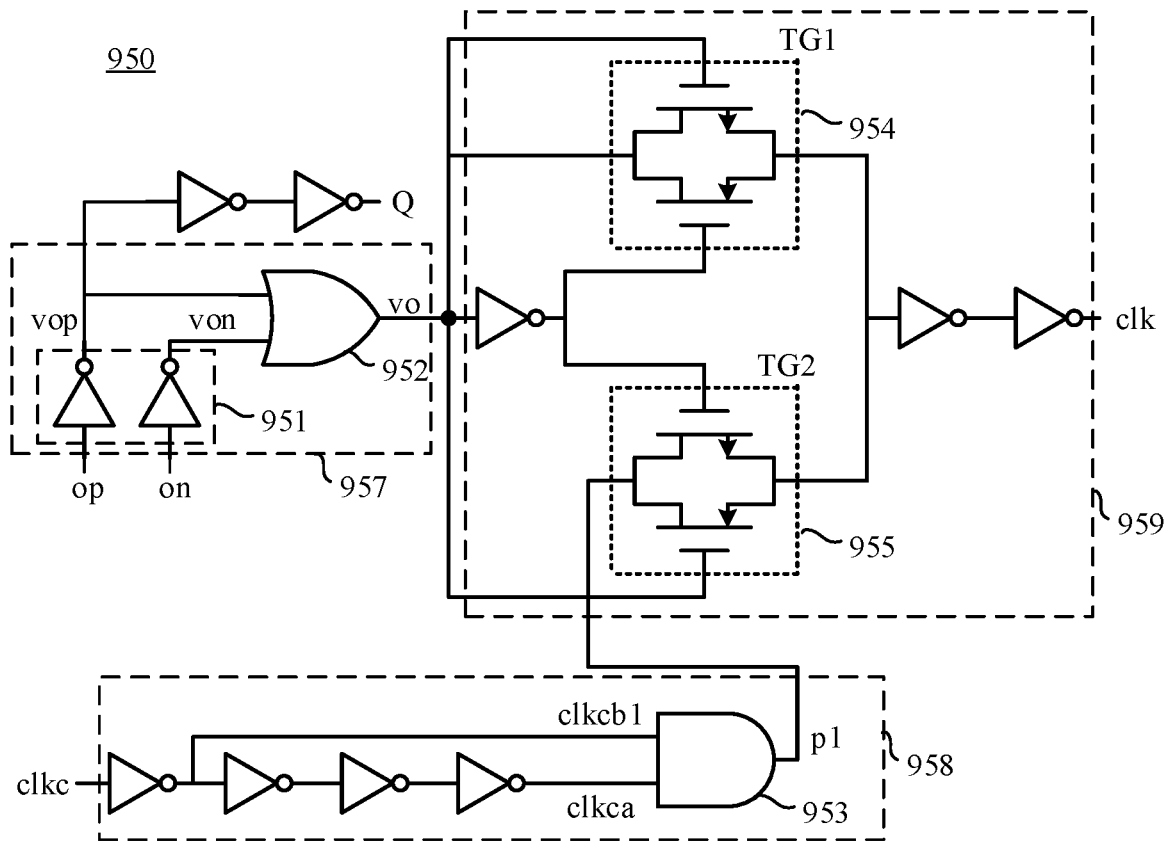
FIG. 9 shows a schematic composition diagram of a clock generation and signal selection circuit according to an embodiment of the present invention.
Figure 10A:
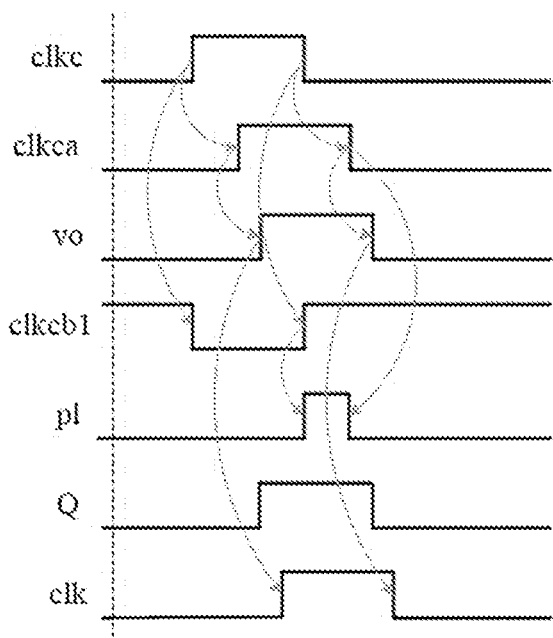
FIGS. 10A-10B show timing diagrams of the circuit shown in FIG. 9 when a metastable state does not occur and when a metastable state occurs.
Figure 10B:
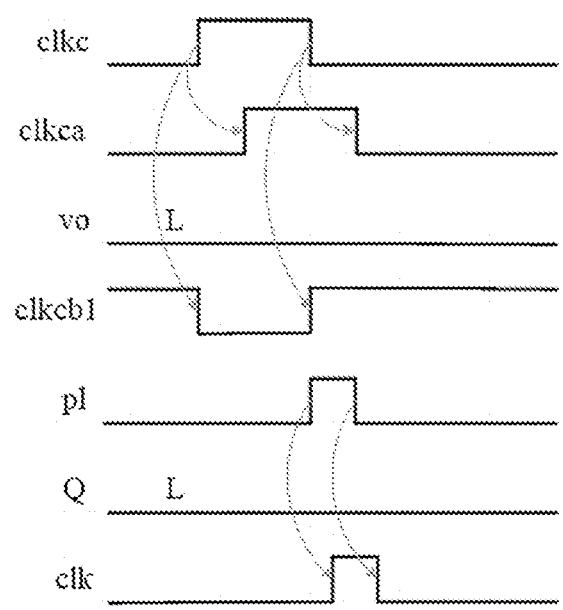

FIG. 9 shows a schematic composition diagram of a read clock generation circuit according to an embodiment of the present invention. FIGS. 10A-B show timing diagrams of the circuit shown in FIG. 9 when a metastable state does not occur and when a metastable state occurs.

As shown in FIG. 9, the illustrated read clock generation circuit 950 is connected to the two outputs 'op' and 'on' of the dynamic comparator. 'Op' and 'on' are respectively passed through an inverter to obtain inverted signals vop and von. Here, the two inverters can be inverters with a lower inversion threshold $V_{th1}$ as described above, and thus can be used as the metastable signal extraction logic gate 951, thereby ensuring that only when the comparators are compared normally (i.e., when a metastable state does not occur) output a read pulse signal.

One of the two outputs of the dynamic comparator, such as the illustrated op, is used as the comparison result Q to be fed into the data register 520. Before being fed into the data register 520, the op can pass through two inverters, thereby increasing the post-drive capability.

Since a high-level pulse must be included in vop and von during the normal comparison of the comparator, when passing through the OR gate 952, the read pulse signal shown as the signal vo of FIG. 10A can be extracted. The first logic gate circuit 957 may include a metastable signal extraction logic gate 951 and an OR gate 952 to generate the read pulse signal vo when the first comparison result 'op' and the second comparison result 'on' correspond to different levels. However, the present invention is not limited to this. For example, if the reset level of the dynamic comparator is low, when a metastable state occurs, both 'op' and 'on' are low, and the first logic gate circuit 957 may only include the OR gate 952. The selection and delay of the read pulse signal vo to obtain the read clock signal clk will be described in detail later.

Correspondingly, the clock clkca can be obtained as shown in FIG. 9 after the delay of the four inverters to the clock clkc. In one embodiment, clkca can be used as the comparator operating clock and sent to the dynamic comparator as shown in FIG. 6. And clkca and the inverted clkcb1 can generate the clock pulse signal p1 via the AND gate 953. Overall, the clock pulse generation circuit 958 generates the clock pulse signal p1 based on the comparator operating clock clkc. In the embodiment of FIG. 9, the clock pulse generation circuit 958 includes four inverters and an AND gate 953. However, the present invention is not limited to this, and the number and connection of the inverters can be changed according to the timing and driving capability requirements.

When a metastable state does not occur as shown in FIG. 10A, the high-level pulse generated by vo can pass through the transmission gate 1 (TG1 954), and after the delay of the TG1 and the two inverters, as the clock clk sent to the data register 520 for reading the comparison result Q.

And when a metastable state occurs as shown in FIG. 1013, vo is always low, meanwhile, clock pulse signal p1 can pass through transmission gate 2 (TG2 955), and after the delay of TG2 and two inverters, as the clock clk sent to the data register 520 for reading the comparison result Q.

In detail, the signal selection circuit 959 may include a first transmission gate (TG1) 954, a second transmission gate (TG2) 955 and a delay circuit 956: two control terminals of the TG1 954 are respectively coupled to the read pulse signal vo and the inverted signal of the read pulse signal vo, its input terminal is coupled to the read pulse signal vo, when the read pulse signal vo is high, the TG1 954 is turned on to output the read pulse signal vo; the e two control terminals of the TG2 955 are respectively coupled to the inverted signal of the read pulse signal vo and the read pulse signal vo, and its input terminal is coupled to the clock pulse signal vo, when the read pulse signal vo is low, the TG2 955 is turned on to output the clock pulse signal p1; the delay circuit 956 generates the read clock signal clk after delaying the outputs of the TG1 954 and the TG2 955.

Figure 11:
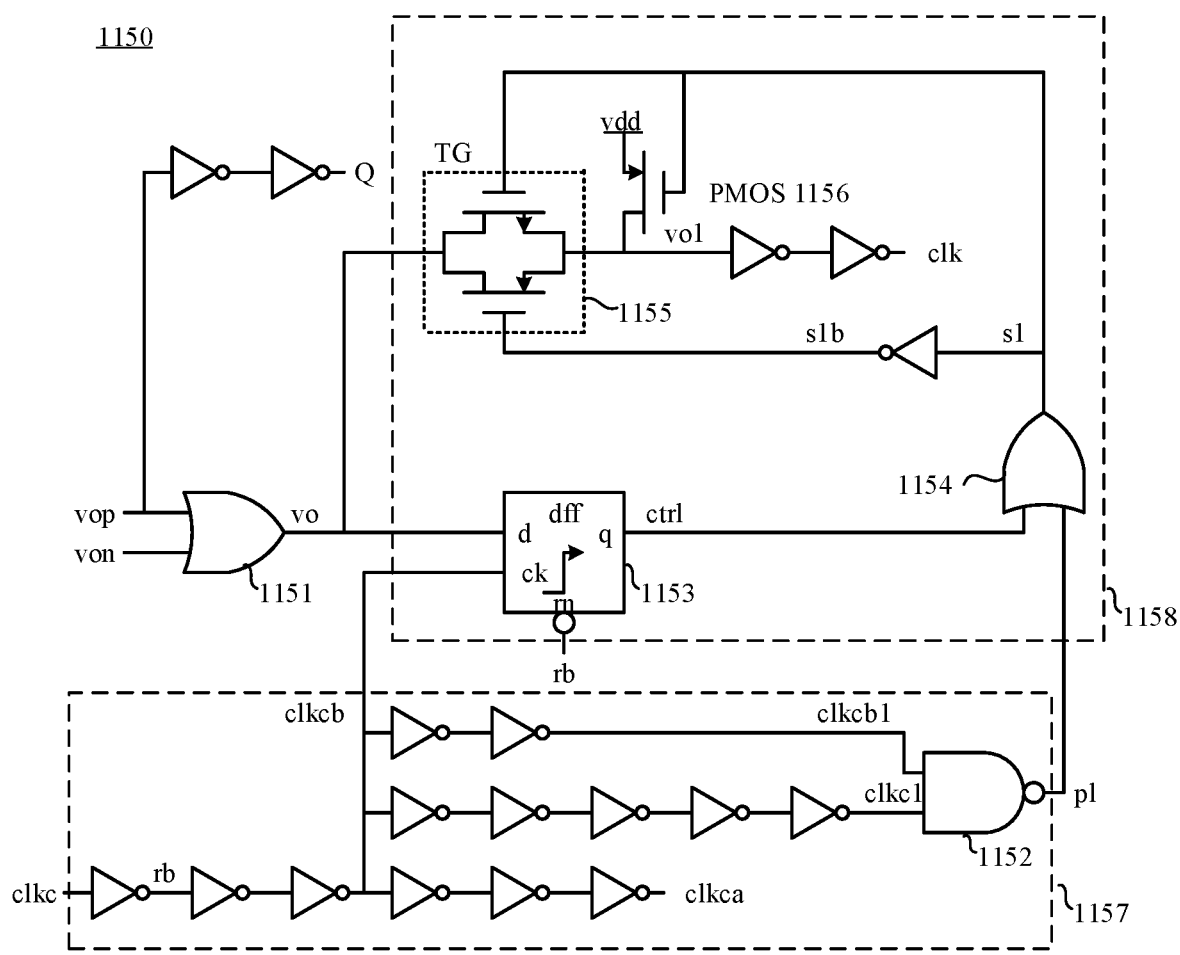
FIG. 11 shows a schematic composition diagram of a read clock generation circuit according to an embodiment of the present invention.
Figure 12A:
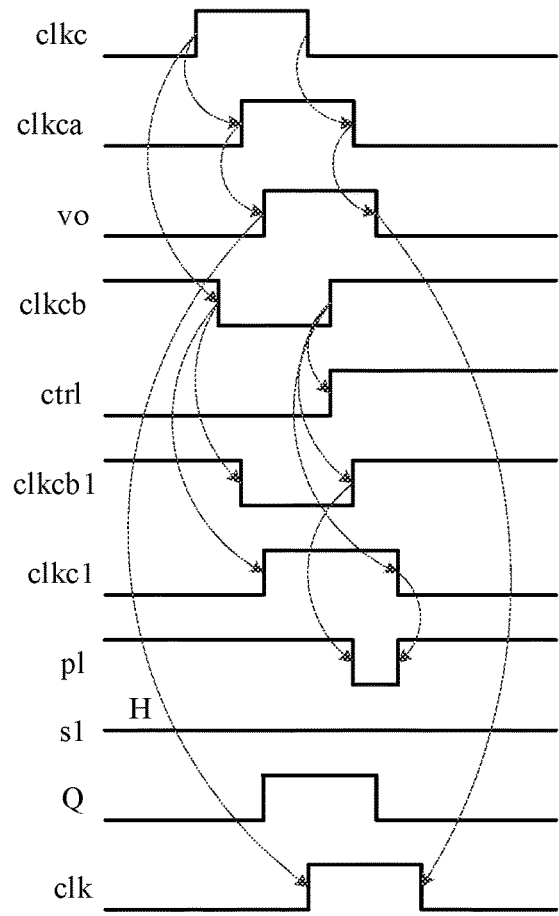
FIGS. 12A-12B show timing diagrams of the circuit shown in FIG. 11 when a metastable state does not occur and when a metastable state occurs.
Figure 12B:
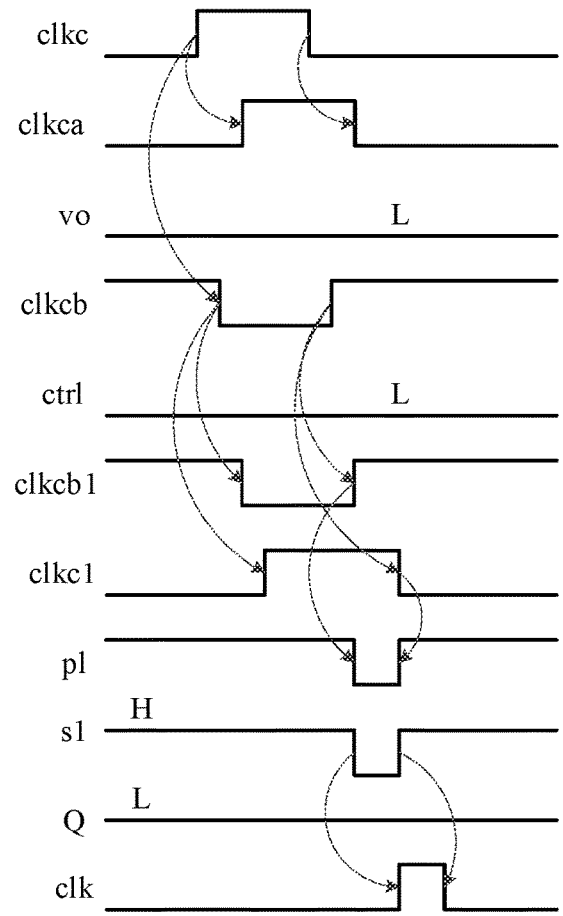

It should be understood that circuits other than those shown in FIG. 9 (e.g., latches) may also be used to implement the clock generation and signal selection circuits of the present invention. FIG. 11 shows a schematic composition diagram of a read clock generation circuit according to an embodiment of the present invention. FIGS. 12A-B show timing diagrams of the circuit shown in FIG. 11 when a metastable state does not occur and when a metastable state occurs respectively.

Specifically, as shown in FIG. 6, the two outputs 'op' and 'on' of the dynamic comparator can respectively pass through the inverter to obtain the inverted signals vop and von, which are thus used as the input of the read clock generation circuit 1150. In other embodiments, the read clock circuit 1150 is also the same as the read clock generation circuit 950 in FIG. 9, including two inverters to invert the two outputs op and on of the dynamic comparator to obtain vop and von. Then, one of the two outputs of the dynamic comparator, such as vop as shown, is used as the comparison result Q to be fed into the data register 520. Before being fed into the data register 520, the vop can pass through two inverters, thereby increasing the post-drive capability.

Since a high-level pulse must be included in vop and von when the comparator operates normally, when passing through the OR gate 1151, the read pulse signal can be extracted, shown as the signal vo in FIG. 12A. Thus, the first logic gate circuit may only include the OR gate 1151 (in other embodiments, it may further include two inverters for realizing metastable signal extraction logic gates, for obtaining vop and von from op and on respectively), and generate the read pulse signal vo when the first comparison result op and the second comparison result on correspond to different levels.

Correspondingly, clock clkc can be delayed by 6 inverters to obtain clkca as shown in FIG. 11, and clkca can be used as comparator operating clock, being sent to the dynamic comparator as shown in FIG. 6. The clock clkc passes through 8 inverters to obtain clkc1, and the clkc1 and the inverted clkcb1 can pass through the NAND gate 1152 to generate the clock pulse signal p1. Overall, the clock pulse generation circuit 1157 generates the clock pulse signal p1 based on the comparator operating clock clkc. In the embodiment of FIG. 11, the clock pulse generation circuit 1157 includes 10 inverters and a NAND gate 1152 (the last three inverters for generating clkca are not counted). However, the present invention is not limited to this, and the number and connection of the inverters can vary according to the timing and driving capability requirements.

The difference between this example and FIG. 9 is particularly embodied in that the clock reading circuit 1150 shown in FIG. 11 uses a latch 1153 and a transmission gate (TG) 1155 under the control of a transistor 1156 to realize the selection of read pulse signal vo and clock pulse signal p1.

Specifically, the signal selection circuit 1158 shown in FIG. 11 may further include a logic circuit that generates a selection pulse signal s1 according to the read pulse signal vo and the clock pulse signal p1. It is implemented as a latch 1153 and an OR gate 1154 in the figure. Under the control of the latch 1153, if a metastable state does not occur, the pulse of p1 (shown as a low-level pulse in the figure) cannot pass through the OR gate 1154. If a metastable state occurs, the pulse of p1 can pass through the OR gate 1154, so that the selection pulse signal s1 varies according to the clock pulse signal p1.

The signal selection circuit 1158 may also include the TG 1155 and the switch transistor 1156 in cooperation therewith. The two control terminals of the TG 1155 are respectively coupled to the selection pulse signal s1 and the inverted signal sib of the selection pulse signal, and the input terminal of the TG 1155 is coupled to the read pulse signal vo. The switch transistor 1156 is implemented as a PMOS transistor, and its control terminal is coupled to the selection pulse signal s1, and its output terminal is coupled to the output terminal of the TG.

When a metastable state does not occur, the selection pulse signal s1 is always high, the switch transistor 1156 is turned off, and the TG 1155 is turned on, so that the read pulse signal vo can be output.

When a metastable state occurs, since the selection pulse signal s1 varies according to the clock pulse signal p1, the switch transistor 1156 is turned on based on the pulse in the selection pulse signal s1 and makes the TG 1155 output the selection pulse signal (described in detail below in conjunction with FIG. 12B). The signal output by the TG 1155 may then pass through a delay circuit consisting of two NOT gates, thereby generating a delayed read clock signal clk.

As shown in FIG. 12A, when a metastable state does not occur, the high-level pulse generated by vo can pass through the latch 1153. Specifically, before the comparator starts to compare, the comparator operating clock clkc is low level, p1 is high level, when clkc jumps high, rb jumps low to reset dff 1153, and ctrl is low level at this time. When a metastable state does not occur in the dynamic comparator, one of the vop and von as the comparison result will generate a high-level pulse, so their OR result vo will generate a high-level pulse, the high-level pulse of vo is read when the rising edge of clkcb arrives, and ctrl thus goes high. The NAND of clkcb1 and clkc1 generates p1. If ctrl is high, the low-level pulse of p1 cannot pass through the OR gate connected thereafter, and the selection pulse signal s1 is always high, and does not vary according to the change of p1. The PMOS transistor 1156 is always off because $V_{GS}$=0, TG 1155 turns on to pass vo being output to clk. Conversely, as shown in FIG. 12B, if a metastable state occurs, vo is always low, ctrl is also low, and the low-level pulse of the clock signal p1 can pass through the OR gate connected thereafter, and the selection pulse signal s1 will generate a low-level pulse. When the selection pulse signal s1 is low, vo1 is pulled high. When the selection pulse signal s1 is high, the TG 1155 is turned on, and vo1 is pulled low. Therefore, vo1 generates a high-level pulse, that is, the pulse signal p1 can pass through the TG 1155, and clk generates a high-level pulse.

Thus, the read clock generation circuit of the present invention can normally generate clock clk regardless of whether there is a metastable state occurs in the comparator or not, thereby avoiding errors caused by the fact that the dff of the data register cannot read the comparison result (i.e., the previous information will be retained) due to the lack of a clock in the metastable state.

Thus, in one embodiment, the synchronous analog-to-digital converter of the present invention includes: a first read clock generation circuit, connected to the first output terminal and the second output terminal of the dynamic comparator, generating a first signal based on the received signal from the first comparison result of the first output terminal and the second comparison result from the second output terminal; a clock pulse generating circuit, connected to the operating clock of the dynamic comparator, generating a second signal based on the operating clock; and a metastable state detection circuit, configured to select the first signal to generate a read clock signal to read the first comparison result of the dynamic comparator when it is detected that the first signal includes a read pulse signal, and select the second signal to generate the read clock signal to read the first comparison of the dynamic comparator when the read pulse signal is not detected in the first signal.

Since a clock signal can be used to read the comparison result when a metastable state occurs, there is no need to reset the comparator when the metastable state occurs. When a metastable state occurs, the signal selection circuit of the present invention selects to generate the read clock signal based on the operating clock of the dynamic comparator to read the first comparison result generated by the dynamic comparator. Thus, the shift register controlled by clkc can still shift normally. Since the logic of the SAR ADC has the function of automatically repairing the influence of metastable state, the occurrence of metastable state in the present invention has no influence on the continuous operation of the SAR ADC, and has less influence on the output result.

In one embodiment, the present invention can also be implemented as an electronic device comprising a SAR ADC as described above. The electronic device can be any electronic device that requires a SAR ADC to convert analog voltages to digital, such as sensor devices and the like.

The SAR ADC according to the present invention has been described in detail above with reference to the accompanying drawings. In the SAR ADC of the present invention, the read clock clk of the data register comes from the output result of the comparator, so that the result can be read immediately after the comparison result is generated, thereby improving the read speed. Further, the signal selection circuit of the present invention can automatically select the backup clock generated by the comparator operating clock clkc as the read clock when a metastable state occurs, so that the comparison result can also be read even when a metastable state occurs, thus avoiding the need to reset the comparator.

Various embodiments of the present invention have been described above, and the foregoing descriptions are exemplary, not exhaustive, and not limiting of the disclosed embodiments. Numerous modifications and variations will be apparent to those skilled in the art without departing from the scope and spirit of the described embodiments. The terminology used herein was chosen to best explain the principles of the embodiments, the practical application or improvement over the technology in the marketplace, or to enable others of ordinary skill in the art to understand the embodiments disclosed herein.

What is claimed is:

1. An SAR ADC comprising:
   a dynamic comparator including a first output terminal and a second output terminal, the dynamic comparator generates a first comparison result and a second comparison result at the first output terminal and the second output terminal respectively based on an operating clock of the dynamic comparator; and
   a read clock generation circuit connected to the first output terminal and the second output terminal, and configured to generate a read clock signal for reading the first or second comparison result based on the first comparison result and the second comparison result received from the dynamic comparator,
   wherein the read clock generation circuit further comprises:
   a signal selection circuit configured to select a read pulse signal generated based on the first comparison result and the second comparison result to generate the read clock signal when the first comparison result and the second comparison result correspond to different levels, and select a clock pulse signal generated based on the operating clock of the dynamic comparator to generate the read clock signal when the first comparison result and the second comparison result correspond to an identical level.

2. The SAR ADC of claim 1, wherein the read clock generation circuit comprises:
   a first logic gate circuit configured to generate a read pulse signal when the first comparison result and the second comparison result correspond to different levels, and the read pulse signal is delayed to obtain the read clock signal.

3. The SAR ADC of claim 2, wherein the first logic gate circuit comprises:
   a metastable signal extraction logic gate connected to the first output terminal and the second output terminal and capable of extracting signals of an identical level when a metastable state occurs, and the metastable signal extraction logic gate is set to extract the signals of the identical level when the levels of the first and the second comparison results are both above an inversion threshold.

4. The SAR ADC of claim 3, wherein the metastable signal extraction logic gate comprises:
   a first NOT gate connected to the first output terminal, and a second NOT gate connected to the second output terminal, wherein:
   when the reset level of the dynamic comparator is a high level, the inversion threshold of the first NOT gate and the second NOT gate is set to be between a low level and a metastable level;
   when the reset level of the dynamic comparator is the low level, the inversion threshold of the first NOT gate and the second NOT gate is set to be between the high level and the metastable level.

5. The SAR ADC of claim 3, wherein the signals of the identical level extracted by the metastable signal extraction logic gates when a metastable state occurs causes the read clock generation circuit to generate the read clock signal based on the operating clock of the dynamic comparator.

6. The SAR ADC of claim 1 further comprising:
   a data register configured to read the first comparison result using the read clock signal generated by the signal selection circuit.

7. The SAR ADC of claim 1, wherein the read clock generation circuit further comprises:
   a first logic gate circuit configured to generate the read pulse signal based on the first comparison result and the second comparison result when the first comparison result and the second comparison result correspond to different levels; and a clock pulse generating circuit configured to generate the clock pulse signal based on the operating clock of the dynamic comparator, wherein the read pulse signal is generated before the clock pulse signal.

8. The SAR ADC of claim 1 wherein the signal selection circuit comprises:

a first transmission gate having two control terminals respectively coupled to the read pulse signal and an inverted signal of the read pulse signal, and an input terminal coupled to the read pulse signal, when the read pulse signal goes high, the first transmission gate is turned on to output the read pulse signal;

a second transmission gate having two control terminals respectively coupled to the inverted signal of the read pulse signal and the read pulse signal, and an input terminal coupled to the clock pulse signal, when the read pulse signal goes low, the second transmission gate is turned on to output the clock pulse signal; and a delay circuit configured to generate the read clock signal after delaying the outputs of the first transmission gate and the second transmission gate.

9. The SAR ADC of claim 1, wherein the signal selection circuit comprises:

a logic circuit configured to generate a selection pulse signal based on the read pulse signal and the clock pulse signal, and the selection pulse signal varies according to the clock pulse signal when the read pulse signal has a level indicating that the first comparison result and the second comparison result correspond to the identical level;

a transmission gate having two control terminals respectively coupled to the selection pulse signal and the inverted signal of the selection pulse signal, and an input terminal coupled to the read pulse signal, when the read pulse signal has a level indicating that the first comparison result and the second comparison result correspond to different levels, the transmission gate is turned on to output the read pulse signal; and a switch transistor having a control terminal coupled to the selection pulse signal, and an output terminal coupled to the output terminal of the transmission gate, when the selection pulse signal does not vary according to the clock pulse signal, the switch transistor is turned off, and when the selection pulse signal varies according to the clock pulse signal, the switch transistor output the clock pulse signal together with the transmission gate; and a delay circuit coupled to the output of the transmission gate and the switch transistor, delays the output to generate the read clock signal.

10. A synchronous ADC comprising:

a first read clock generation circuit connected to a first output terminal and a second output terminal of a dynamic comparator, generating a first signal based on a first comparison result received from the first output terminal and a second comparison result received from the second output terminal;

a clock pulse generating circuit connected to the operating clock of the dynamic comparator, generating a second signal based on the operating clock; and a metastable state detection circuit configured to select the first signal to generate a read clock signal to read the first comparison result of the dynamic comparator when it is detected that the first signal includes a read pulse signal, and select the second signal to generate the read clock signal to read the first comparison of the dynamic comparator when the read pulse signal is not detected in the first signal.

11. An electronic device, comprising:

An SAR ADC comprising:

a dynamic comparator including a first output terminal and a second output terminal, the dynamic comparator generates a first comparison result and a second comparison result at the first output terminal and the second output terminal respectively based on an operating clock of the dynamic comparator; and a read clock generation circuit connected to the first output terminal and the second output terminal, and configured to generate a read clock signal for reading the first or second comparison result based on the first comparison result and the second comparison result received from the dynamic comparator, wherein the read clock generation circuit further comprises:

a signal selection circuit configured to select a read pulse signal generated based on the first comparison result and the second comparison result to generate the read clock signal when the first comparison result and the second comparison result correspond to different levels, and select a clock pulse signal generated based on the operating clock of the dynamic comparator to generate the read clock signal when the first comparison result and the second comparison result correspond to an identical level.

12. The electronic device of claim 11, wherein the read clock generation circuit comprises:

a first logic gate circuit configured to generate a read pulse signal when the first comparison result and the second comparison result correspond to different levels, and the read pulse signal is delayed to obtain the read clock signal.

13. The electronic device of claim 12, wherein the first logic gate circuit comprises:

a metastable signal extraction logic gate connected to the first output terminal and the second output terminal and capable of extracting signals of an identical level when a metastable state occurs, and the metastable signal extraction logic gate is set to extract the signals of the identical level when the levels of the first and the second comparison results are both above an inversion threshold.

14. The electronic device of claim 13, wherein the metastable signal extraction logic gate comprises:

a first NOT gate connected to the first output terminal, and a second NOT gate connected to the second output terminal, wherein:

when the reset level of the dynamic comparator is a high level, the inversion threshold of the first NOT gate and the second NOT gate is set to be between a low level and a metastable level;

when the reset level of the dynamic comparator is the low level, the inversion threshold of the first NOT gate and the second NOT gate is set to be between the high level and the metastable level.

15. The electronic device of claim 13, wherein the signals of the identical level extracted by the metastable signal extraction logic gates when a metastable state occurs causes the read clock generation circuit to generate the read clock signal based on the operating clock of the dynamic comparator.

16. The electronic device of claim 11 further comprising:
a data register configured to read the first comparison result using the read clock signal generated by the signal selection circuit.

17. The electronic device of claim 11, wherein the read clock generation circuit further comprises:
a first logic gate circuit configured to generate the read pulse signal based on the first comparison result and the second comparison result when the first comparison result and the second comparison result correspond to different levels; and
a clock pulse generating circuit configured to generate the clock pulse signal based on the operating clock of the dynamic comparator,
wherein the read pulse signal is generated before the clock pulse signal.

18. The electronic device of claim 11, wherein the signal selection circuit comprises:
a first transmission gate having two control terminals respectively coupled to the read pulse signal and an inverted signal of the read pulse signal, and an input terminal coupled to the read pulse signal, when the read pulse signal goes high, the first transmission gate is turned on to output the read pulse signal;
a second transmission gate having two control terminals respectively coupled to the inverted signal of the read pulse signal and the read pulse signal, and an input terminal coupled to the clock pulse signal, when the read pulse signal goes low, the second transmission gate is turned on to output the clock pulse signal; and
a delay circuit configured to generate the read clock signal after delaying the outputs of the first transmission gate and the second transmission gate.

19. The electronic device of claim 11, wherein the signal selection circuit comprises:
a logic circuit configured to generate a selection pulse signal based on the read pulse signal and the clock pulse signal, and the selection pulse signal varies according to the clock pulse signal when the read pulse signal has a level indicating that the first comparison result and the second comparison result correspond to the identical level;
a transmission gate having two control terminals respectively coupled to the selection pulse signal and the inverted signal of the selection pulse signal, and an input terminal coupled to the read pulse signal, when the read pulse signal has a level indicating that the first comparison result and the second comparison result correspond to different levels, the transmission gate is turned on to output the read pulse signal; and
a switch transistor having a control terminal coupled to the selection pulse signal, and an output terminal coupled to the output terminal of the transmission gate, when the selection pulse signal does not vary according to the clock pulse signal, the switch transistor is turned off, and when the selection pulse signal varies according to the clock pulse signal, the switch transistor output the clock pulse signal together with the transmission gate; and
a delay circuit coupled to the output of the transmission gate and the switch transistor, delays the output to generate the read clock signal.

* * * * *